United States Patent [19]

Sakamoto et al.

[11] Patent Number: 4,908,590
[45] Date of Patent: Mar. 13, 1990

[54] CHIP-LIKE LC FILTER

[75] Inventors: Yukio Sakamoto; Shinichi Madokoro; Shingo Okuyama, all of Kyoto, Japan

[73] Assignee: Murata Manufacturing Co., Ltd., Japan

[21] Appl. No.: 182,105

[22] Filed: Apr. 15, 1988

Related U.S. Application Data

[63] Continuation-in-part of Ser. No. 1,702, Jan. 9, 1987, Pat. No. 4,801,904.

[30] Foreign Application Priority Data

Jan. 14, 1986 [JP] Japan .................. 61-3537[U]
Jan. 29, 1986 [JP] Japan .................. 61-12375[U]
Jun. 27, 1986 [JP] Japan .................. 61-99405[U]
Apr. 16, 1987 [JP] Japan .................. 62-58143[U]

[51] Int. Cl.$^4$ ............................... H03H 7/01
[52] U.S. Cl. ............................... 333/183; 333/185; 361/302; 439/607; 439/620; 439/816; 439/825
[58] Field of Search ............................... 333/182–185; 361/302; 439/607, 620, 816, 825, 842, 851

[56] References Cited

U.S. PATENT DOCUMENTS

| | | | |
|---|---|---|---|
| 2,111,710 | 3/1938 | Van Loon | 333/182 |
| 2,973,490 | 2/1961 | Schlicke | 333/182 |
| 3,381,261 | 4/1968 | Deakin | 439/851 X |
| 3,546,638 | 12/1970 | Park | 333/182 |
| 3,597,711 | 8/1971 | Buckley | 333/183 |
| 4,376,922 | 3/1983 | Muzslay | 333/182 |
| 4,648,681 | 3/1987 | Pass et al. | 439/620 |
| 4,652,842 | 3/1987 | Kling et al. | 333/182 |
| 4,753,617 | 6/1988 | Jacobs | 439/825 |

FOREIGN PATENT DOCUMENTS 1288757 9/1972 United Kingdom ............... 439/851

Primary Examiner—Eugene R. LaRoche
Assistant Examiner—Benny Lee
Attorney, Agent, or Firm—Ostrolenk, Faber, Gerb & Soffen

[57] ABSTRACT

A chip-like LC filter which comprises a cylindrical magnetic element having a through hole. A cylindrical capacitor element has a through hole and terminal electrodes formed on inner and outer peripheral surfaces thereof. A central conductor is inserted in the through holes of the magnetic element and the capacitor element, which through holes are aligned along an axial direction. The terminal electrode on the inner peripheral side of the capacitor element is electrically connected with the central conductor. Cap-shaped external terminal members are respectively provided on both end portions of the central conductor, so that the magnetic element and the capacitor element are located between the external terminal members. The central conductor is obtained by cylindrically rolling a metal plate, so that a portion located on the outer periphery of the rolled metal plate defines an elastic contact portion which elastically comes into pressure contact with the terminal electrode on the inner peripheral surface of the capacitor element.

18 Claims, 3 Drawing Sheets

CHIP-LIKE LC FILTER

BACKGROUND OF THE INVENTION

This application is a continuation-in-part of U.S. application Ser.No. 001,702 filed Jan. 9, 1987 and now Pat. No. 4,801,904 issued Jan. 31, 1989.

1. Field of the Invention

The present invention relates to a chip-like LC filter, and more particularly, it relates to a chip-like LC filter which may be used a noise filter, for example.

2. Description of the Prior Art

In general, a filter device for filtering high frequency noise signals comprises at least one inductance element and at least one capacitor element. For example, U.S. Pat. No. 4,320,364 granted to Sakamoto et al. and issued on Mar. 16, 1982 discloses the structure of such an LC filter treated as one electtronic component.

The '364 patent discloses various embodiments, and FIG. 16 thereof concretely shows the structure of a so-called T-type filter circuit formed as a single electronic component comprising one capacitor element and two inductance elements. In this structure, a pair of opposite capacitor electrodes are provided on both major opposite surfaces of a dielectric plate to form a capacitor element. A substantially U-shaped input/output lead line is soldered to one of the electrodes, and both legs thereof are inserted into respective ferrite bead members. A ground lead line is soldered to the other capacitor electrode.

Accordingly, such an LC filter is an electronic component having three lead lines. In order to mount the LC filter on, e.g., a printed circuit board, the three lead lines are inserted in holes provided in the printed circuit board respectively, to be soldered to respective conducative patterns provided on the printed circuit board.

However, the LC filter having the aforementioned structure is so difficult to manufacture that the assembly operation thereof is complicated. Further, since a dielectric plate having a relatively wide major surface is employed, it is difficult to reduce the size of the electronic component, so mounting density on the printed circuit cannot be substantially improved. Further, mounting of the LC filter is complicated since the same is mounted on the printed circuit board by its lead lines. In addition, the LC filter is connected to a ground conductive pattern of the printed circuit board through a ground lead line, whereby undesired inductance components are generated on the ground lead line. Thus, the effect of noise elimination is lowered and excellent filter characteristics cannot be obtained.

SUMMARY OF THE INVENTION

Accordingly, an object of the present invention is to provide an LC filter which can be easily assembled.

Another object of the present invention is to provide a chip-like LC filter having no lead lines, which can be easily mounted on a printed circuit board.

Still another object of the present invention is to provide a chip-like LC filter which can improve mounting density on a printed circuit board.

A further object jof the present jinvention is to provide an LC filter having excellent filter characteristics.

A chip-like LC filter according to the present invention comprises at least one magnetic element for forming an inductance element. The magnetic element has a first through hole extending along the axial direction thereof. The LC filter further comprises at least one capacitor element. The capacitor element is provided with a first terminal electrode on the outer peripheral surface thereof as well as a second through hole extending along the axial direction thereof. A second terminal electrode is formed on the inner peripheral surface defining the second through hole. A central conductor is inserted through the first and second through holes in order to retain the magnetic element and the capacitor element in an axially aligned state. The second terminal electrode of the capacitor element is electrically connected with the central conductor. First and second external terminal means are provided on respective end portions along the longitudinal direction of the central conductor respectively. The central conductor is obtained by cylindrically rolling a metal plate. This central conductor is provided along at least part of its longitudinal direction with an elastic contact portion which exerts elasticity to come into pressure contact with the second terminal electrode of the capacitor element to be electrically connected with the same, by a portion located on the outer periphery of the rolled metal plate. Preferably the first and second external terminal means include first and second conductive cap-shaped members, respectively, which partially cover whichever of the magnetic element or the capacitor element is located on each end portion of the central conductor and which are electrically connected with the central conductor.

A chip-like LC filter that requires no lead line can be obtained by the present invention. Therefore, the LC filter can be directly mounted to conductive patterns provided on a printed circuit board or the like by the first terminal electrode of the capacitor element and the first and second external terminal means. Thus, there is no need to provide holes in the circuit board or insert lead lines in such holes in order to mount the LC filter on the circuit board. In the chip-like LC filter according to the present invention, however, lead lines may be added for serving as an external connection terminal to the first terminal electrode of the capacitor element and the first and second external terminal means connected to the respective end portions of the central conductor.

According to the present invention, further, the first terminal electrode of the capacitor element can be directly electrically connected to the ground pattern of the circuit board by soldering or the like, whereby the portion thus connected can be prevented from generating undesired inductance components, to effectively remove noise components. Thus, an LC filter having excellent filter characteristics can be obtained.

In addition, the magnetic element and the capacitor element are both arranged on the central conductor inserted through the same, whereby the entire LC filter is reduced in size to improve mounting density on the circuit board.

According to the present invention, the elastic contact portion formed in the central conductor is brought into pressure contact with the second terminal electrode of the capacitor element, so that the capacitor element can be electrically connected with and mechanically fixed to the central conductor with no soldering, for example. The elastic contact portion is thus brought into pressure contact with the second terminal electrode of the capacitor element so as to reliably achieve electrical connection, which avoids several problems, as will now be explained: If contraction occurs in the solder that may be employed for connecting the first and second external terminal means to conductive patterns provided on a circuit board, a force will be created which pulls on both ends of the central conductor, whereby the diameter of the central conductor is slightly reduced. If the central conductor and the second terminal electrode of the capacitor element were soldered to each other in this case, such reduction in diameter of the central conductor might break the soldering portion between the central conductor and the second terminal electrode. Such a soldering portion may also be broken by difference in thermal expasion coefficient between the central conductor and the capacitor element.

According to a preferred embodiment of the present invention, first and second cavities are formed at respective end surfaces of the central conductor, while first and second projections to be engaged with the first and second cavities are formed in first and second cap-shaped members, which provide the first and second external terminal means.

According to such a preferred embodiment, the cap-shaped members can be correctly positioned with respect to the central conductor, while the inner surfaces of the cap-shaped members can be reliably brought into contact with the respective end portions of the central conductor. Thus, when the cap-shaped members are electrically connected with the central conductor by resistance welding, for example, the contact resistance between the cap-shaped members and the central conductor can be maintained constantly over relatively wide surfaces or regions, thereby to facilitate reliable resistance welding in order to obtain uniformity and strength.

The aforementioned preferred structure is also effective in case of electrically connecting the cap-shaped members with the central conductor by means other than resistance welding. When such electrical connection is attained by solder or conductive paste, for example, the cap-shaped members are also correctly positioned with respect to the central conductor so that the inner surfaces thereof are properly brought into contact with the respective end portions of the central conductor, to permit reliable electrical connection through the solder or conductive paste.

These and other objects, feactures, aspects and advantages of the present invention will become more apparent from the following detailed description of the present invention when taken in conjunction with the accompanying drawings.

DESCRIPTION OF THE PREFERRED EMBODIMENTS

Figure 1:
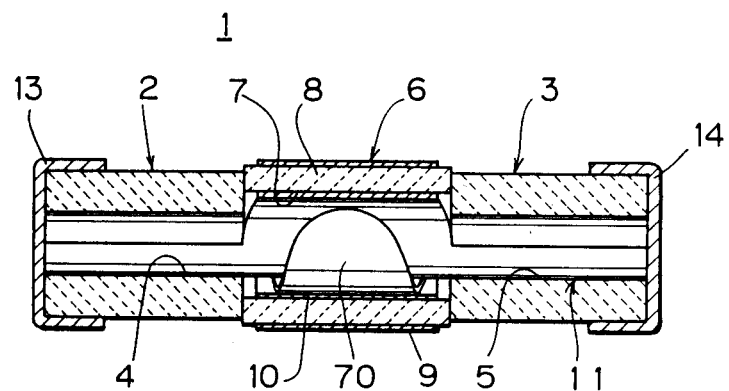
FIG. 1 is a longitudinal sectional view of a chip-like LC filter according to an embodiment of the present invention.
Figure 3:
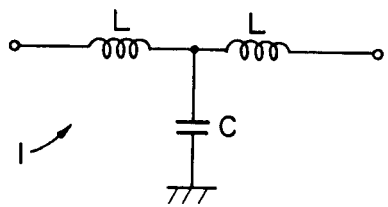
FIG. 3 illustrates an equivalent circuit obtained by the filter as shown in FIG. 1.
Figure 4:
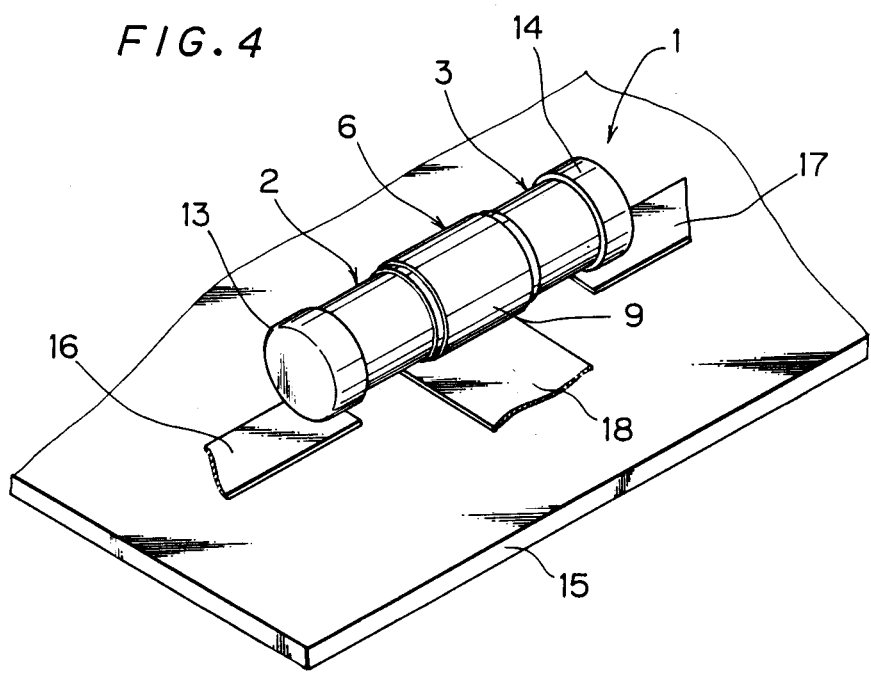
FIG. 4 is a perspective view showing an example of how the filter as shown in FIG. 1 may be mounted on a circuit board.

FIGS. 1 and 4 illustrate a chip-like LC filter 1 according to an embodiment of lthe present invention, which is adapted to form a so-called T-type filter circuit as shown in FIG. 3. In this type of circuit, the chip-like LC filter 1 comprises two inductance elements L and a capacitor element C. In the structure concretely shown in FIGS. 1 and 4, the two inductance elements comprise magnetic elements 2 and 3 which here are, e.g., cylindrical ferrite beads. The magnetic elements 2 and 3 are provided with axially extending through holes 4 and 5. The single capacitor element comprises a cylindrical capacitor 6, which comprises a cylindrical dielectric member 8 having an axially extending through hole 7. A first terminal electrode 9 is formed on the outer peripheral surface of the dielectric member 8. A second terminal electrode 10 is formed on the inner peripheral surface defining the through hole 7. In this embodiment, the first terminal electrod 9 and the second terminal electrode 10 are opposite to each other, separated by the dielectric member 8, to form electrostatic capacitance between them. The first terminal electrode 9 is preferably formed to leave margins on both edges of the radially outer peripheral surfaces of the dielectric member 8.

In order to retain the magnetic elements 2 and 3 and the cylindrical capacitor 6 in an axially aligned state, a central conductor 11 of a conductive material such as metal is inserted in the through holes 4, 5 and 7. In this embodiment, the through holes 4, 5 and 7 are circular in section, while the central conductor 11 is in the form of a rod with a substantially circular cross section.

Cap-shaped members 13 and 14 for serving as first and second external terminal means are formed of a conductive material such as metal, and connected to respective end portions of the central conductor 11 by resistance welding, for example. The cap-shaped members 13 and 14 are preferably prepared from iron-nickel alloy, and plated with silver on the surfaces thereof. The cap-shaped members 13 and 14 are arranged to partially cover the elements provided on the respective end portions of the central conductor 11, i.e., the magnetic elements 2 and 3. Accordingly, the cylindrical capacitor 6, which is provided by the above-described assembly steps, larger in diameter than the magnetic elements 2 and 3, and its size corresponds particularly to the thickness (outer diameter) of the cap-shaped members 13 and 14. Thus, the outer terminal electrode 9 of the cylindrical capacitor 6 defines an outer peripheral surface aligned substantially in a common imaginary cylindrical surface; with the outer peripheral surfaces of the cap-shaped members 13 and 14.

Figure 2:
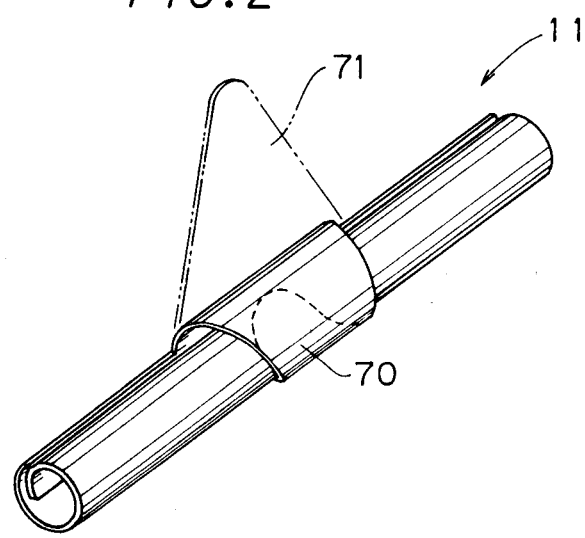
FIG. 2 is a perspective view showing a central conductor employed in the filter as shown in FIG. 1.

Referring to FIG. 2, the central conductor 11 is obtained by rolling a metal plate which is for example, about 0.05 to 0.08 mm in thickness. Such a metal plate may be made of relatively elastic phosphor bronze, for example. The metal plate for forming the central conductor 11 is substantially in a T-shaped configuration when unrolled. Employing such a T-shaped metal plate, first a horizontally extending portion is rolled and then a vertically exteding portion 71 is rolled thereon as shown by phantom lines in FIG. 2. In the rolled state as shown by solid lines in FIG. 2, therefore, the said vertically extending portion 71 forms an elastic contact portion 70, which also is a relatively larger diameter portion.

In this embodiment, the elastic contact portion 70 tends to unroll due to the resiliency of the central conduction material and thereby comes into pressure contact with the inner termianl electrode 10 of the cylindrical capacitor 6, whereby the cylindrical capacitor 6 can be electrically connected with and mechanically fixed to the central conductor 11 without employing solder. Further, the central conductor 11 can outwardly exert the outward elastic force along the entire longitudinal extent thereof, to hold the magnetic elements 2 and 3 in prescribed positions on the central conductor 11 before the cap-shaped members 13 and 14 are attached. When such a function is not desired, a gap may be left between the central conductor 11 and each of the magnetic elements 2 and 3.

This embodiment is adapted such that the inductance obtained by its inductance elements 2 and 3 is not reduced by provision of an increase in the electrostatic capacitance of its capacitor element 6, or such that its electrostatic capacitance is not reduced by provision of an increase in its inductance.

A relatively larger diameter portion provided by the elastic contact portion 70 and reatively small diameter portions located on both sides of the elastic contact portion 70 are distributed along the longitudinal direction of the central conductor 11. The cylindrical capacitor 6 is arranged on the large diameter portion. The magnetic elements 2 and 3 are arranged on the small diameter portions respectively.

Thus, the dielectric member 8 of the cylindrical capacitor 6 can be made relatively smaller in thickness than the magnetic elements 2 and 3. Therefore, the inductance obtained by the magnetic elements 2 and 3 can be increased while also increasing the electrostatic capacitance obtained by the cylindrical capacitor 6. FIG. 4 illustrates an example of how the chip-like LC filter 1 may be mounted. A substrate 15 such as a printed circuit board is provided on its one surface with a pair of input/output conductive patterns 16 and 17 and a ground conductive pattern 18, as partially shown in FIG. 4. The first terminal electrode 9 and the first and second cap-shaped members 13 and 14 of the chip-like LC filter 1 have outer peripheral surfaces aligned substantially in the same plane as shown in FIG. 1. Therefore, when the LC filter 1 is placed on the substrate 15 as shown in FIG. 4, the first cap-shaped member 13 comes into contact with the conductive pattern 16 and the second cap-shaped member 14 comes into contact with the conductive pattern 17 while the first terminal electrode 9 comes into contact with the conductive pattern 18. Solder (not shown) or the like may be applied to respective such contact portions to make the desired connections. Assuming that the conductive pattern 16 is in the input side of a signal line, the signal flows from the conductive patterns 16, to the conductive pattern 17 in the output side, through the first cap-shaped member 13, the central conductor 11 and the second cap-shaped member 14. Undesired noise components superimposed on such a signal line are eliminated by passing through the first terminal electrode 9 of the cylindrical capacitor 6 to the ground conductive pattern 18. In this case, the chip-like LC filter 1 serves as a noise filter The LC filter 1 can be soldered to the substrate 15 simultaneously with other electronic components (not shown) to be mounted on the substrate 15. Specifically, the LC filter 1 and other components may be provisionally fixed to the substrate 15 by an adhesive agent or the like and then dipped in a molten solder tank, thereby to simultaneously solder the plurality of electronic components to the substrate 15.

The first terminal electrode 9 provided on the outer peripheral surface of the cylindrical capacitor 6 is formed to leave margins on both edges of the said outer peripheral surface as hereinabove described. This prevents shorting problems from being caused by the solder for connecting the first terminal electrode 9 of the cylindrical capacitor 6 with the conductive pattern 18. This solder may fill the clearances between both end surfaces of the cylindrical capacitor 6 and the end surfaces of the magnetic elements 2 and 3 by a capillary phenomenon when the chip-like LC filter 1 is mounted on the substrate 15 as in FIG. 4, for example, thereby may short the first and second terminal electrodes 9 and 10, by virtue of the aforementioned margins. Also, in a case where the magnetic elements 2 and 3 are formed of a relatively conductive material, the first and second terminal electrodes 9 and 10 are prevented from being shorted by the magnetic elements 2 and 3 by virtue of the said margins. However, the first and second terminal electrodes 9 and 10 may be formed without margins on the outer and inner peripheral surfaces of the cylindrical dielectric member 8, respectively.

Figure 5:
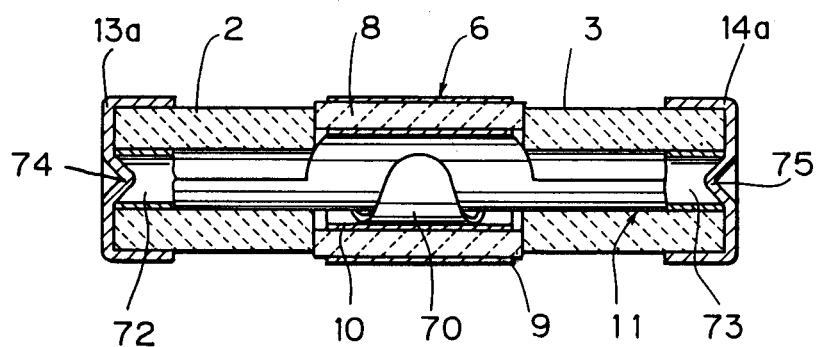
FIG. 5 is a longitudinal sectional view showing a chip-like LC filter according to another embodiment of the present invention.

FIG. 5 shows another embodiment of the present invention. Referring to FIG. 5, elements corresponding to those included in the embodiment as shown in FIG. 1 are indicated by similar reference numerals, to omit redundant description.

A central conductor 11, being formed by rolling a metal plate, has inherently a through hole along its central axis. Consequently, the central conductor 11 is provided on both end surfaces thereof with openings defining cavities 72 and 73 at least in respective end portions of the central conductor 11.

The feature of the embodiment as shown in FIG. 5 resides in the configuration of cap-shaped members 13a and 14a for serving as external terminal means. The cap-shaped members 13a and 14a are provided in their inner surfaces with projections 74 and 75, which are inserted from the openings formed on both end surfaces of the central conductor 11 to be engaged with the cavities 72 and 73. In this embodiment, the projections 74 and 75 are formed by crimping or bending respective parts of the materials forming the cap-shaped members 13a and 14a when said cap-shaped members are formed. However, such projections 74 and 75 may in place be formed by raising up parts of the cap-shaped members 13a and 14a or increasing the thickness of such parts. Alternatively, projections equivalent to the projections 74 and 75 may be formed by connecting separately prepared rivet like members to the cap-shaped members 13a and 14a.

The cap-shaped members 13a and 14a are correctly positioned with respect to the central conductor 11 by means of the projections 74 and 75, since the inner surfaces thereof are properly brought into contact with the respective end portions of the central conductor 11. Thus, the cap-shaped members 13a and 14a can be electrically connected with the central conductor 11 in an excellent welding state by resistance welding, for example. In the case of resistance welding, the cap-shaped members 13a and 14a are preferably plated with silver, the melting point of which is about 950° C., if the central conductor 11 is made of phosphor bronze, the melting point of which is about 1000° C., as hereinabove described. Due to having such approximate melting points, the phosphor bronze and silver material forming the regions which are in contact with each other are substantially simultaneously melted by the resistance welding process to produce an alloy, thereby to facilitate such welding.

Figure 6:
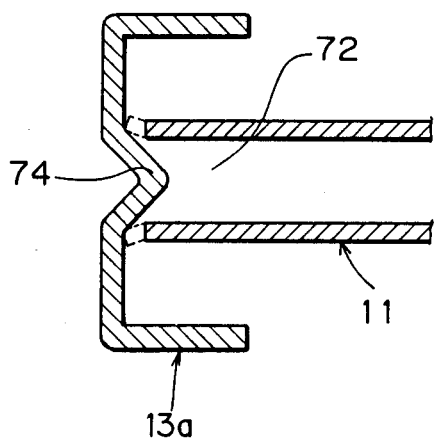
FIG. 6 is a partially fragmented end view for illustrating a phenomenon caused when the cap-shaped member is positioned on an end portion of the central conductor as shown in FIG. 5.

In this embodiment, further, the projections 74 and 75 are provided in a substantially conical configuration. An advantage of such a configuration is as follows: Referring to FIG. 6, showing the projection 7 formed in the cap-shaped member 13a, an end portion of the central conductor 11 is outwardly expanded as shown by broken lines by a so-called "wedge action" caused by the engagement of the projection 74 with the cavity 72 of the central conductor 11. Thus, the projection 74 is further reliably brought into contact with the end portion of the central conductor 11 substantially over the entire periphery, thereby to more effectively facilitate the aforementioned resistance welding. It is pointed out here that the end portion of the central conductor 11 is exaggeratedly distorted in FIG. 6, for lthe convenience of illustration.

However, it is not requisite to provide the projections 74 and 75 in the substantially conical configuration as shown in the figures, in order to attain the aforementioned advantage. For example, the projections 74 and 75 may be spherical, or at least the forward (inward) end portions thereof may be smaller in their diameter than their bottom (outward) portions. If such an advantage is not required, however, the projections 74 and 75 may be simply provided in the form of cylinders, for example.

Although the cap-shaped members 13a and 14a are electrically connected with the central conductor 11 by resistance welding in the above embodiment, such electrical connection may also be achieved by solder or conductive paste. Also in this case, the projections 74 and 75 contribute to reliable electrical connection.

While embodiments of the present invention have been described with reference to the drawings, the following modifications are also applicable within the scope of the present invention:

The numbers of the magnetic element(s) and the capacitor elements(s) employed in a single chip-like LC filter, and the ways these elements are combined, can be arbitraarily selected.

Further, the magnetic elements, the capacitor element, the central conductor and the like may be in arbitrary configuration and size. For example, the magnetic elements and the capacitor element may be angular in section.

In addition, the LC filter according to the present invention is not restricted to being a noise filter.

Although the present invention has been described and illustrated in detail with reference to embodiments thereof, it is clearly understood that the same is by way of illustration and example only and is not to be taken by way of limitation, the spirit and scope of the present invention being limited only by the terms of the appended claims.

What is claimed is:

1. A chip-like LC filter comprising:
a magnetic element having a first through hole extending along a longitudinal axial direction thereof;
a capacitor element provided with a first terminal electrode formed on an outer peripheral surface thereof, a second through hole extending along a longitudinal axial direction thereof, and a second terminal electrode formed on an inner peripheral surface thereof and defining said second through hole;
a central conductor comprising a cylindrically rolled metal plate made of a resilient material, said metal plate thereby tending to resiliently unroll and exert an outward pressure radially of said central conductor, and inserted in said first and second through holes which are aligned along said axial direction to retain said magnetic element and said capacitor element in an axially aligned state, said central conductor being electrically connected with said second terminal electrode of said capacitor element; and
first and second external terminal means respectively provided on respective longitudinal end portions of said central conductor, said first and second external terminal means being electrically connected with said central conductor; and
said central conductor being provided along at least part of its length along said longitudinal direction with an elastic contact portion which exerts said outward pressure radially of said central conductor to come into pressure contact with said second terminal electrode of said capacitor element to be electrically connected with the same, said elastic contact portion being located on an outer peripheral part of said rolled metal plate.

2. A chip-like LC filter in accordance with claim 1, wherein said first and second external terminal means respectively comprise first and second conductive cap-shaped members, one of said cap-shaped members at least partially covering said magnetic element which is located on an end portion of said central conductor and is electrically connected with said central conductor.

3. A chip-like LC filter in accordance with claim 2, further comprising a secon magnetic element, said magnetic element, said capacitor element and said second magnectic element are arranged in this sequence on said central conductor, whereby said first and second cap-shaped members are arranged to at least partially cover said magnetic element and said second magnetic element respectively.

4. A chip-like LC filter in accordance with claim 2, wherein said central conductor is made of phosphor bronze and said first and second cap-shaped members are made of a silver-platable material and are plated with silver.

5. A chip-like LC filter in accordance with claim 1, wherein said capacitor element forms electrostatic capacitance between said first and second terminal electrodes.

6. A chip-like LC filter in accordance with claim 1, wherein said magnetic element and said capacitor element are in the form of cylinders, said first and second through holes are circular in cross-section and said central conductor is in the form of a rod with a circular cross section.

7. A chip-like LC filter in accordance with claim 6, wherein said first terminal electrode and said first and second external terminal means have outer peripheral surfaces aligned substantially in a common imaginary cylindrical surface.

8. A chip-like LC filter in accordance with claim 6, wherein said central conductor is relatively increased in diameter in a portion provided with said elastic contact portion.

9. A chip-like LC filter comprising:

a magnetic element having a first through hole extending along a longitudinal axial direction thereof;

a capacitor element provided with a first terminal electrode formed on an outer peripheral surface thereof, a second through hole extending along a longitudinal axial direction thereof, and a second terminal electrode formed on an inner peripheral surface thereof and defining said second through hole;

a central conductor comprising a cylindrically rolled metal plate which is inserted in said first and second through holes to retain said magnetic element and said capacitor element in an axially aligned state, said central conductor being electrically connected with said second terminal electrode of said capacitor element; and first and secon external terminal means respectively provided on respective longitudinal end portions of said central conductor, said first and second external terminal means being electrically connected with said central conductor; and said central conductor being provided along at least part of its length along said longitudinal direction with an elastic contact portion which exerts an outward pressure radially of said central conductor to come into pressure contact with said second terminal electarode of said capacitor element to be elcatrically connected with the same, said elastic contact portion being located on an outer peripheral part of said rolled metal plate;

wherein said first and second external terminal means respectively comprises first and second conductive cap-shaped members, one of said cap-shaped members at least partially covering said magnetic element which is located on an end portion of said central conductor and is electrically connected with said central conductor;

wherein first and second cavities are provided adjacent respective end surfaces of said central conductor while first and second projections are provided on said first and second cap-shaped members and engaged with said first and second cavities.

10. A chip-like LC filter in accordance with claim 9, wherein said first and second projections are substantially conical in configuration.

11. A chip-like LC filter in accordance with claim 9, wherein said first and second projections are formed by partially squeezing the materials forming said first and second cap-shaped members when said cap-shaped members are formed.

12. A chip-like LC filter comprising:

a magnetic element having a first through hole extending along a longitudinal axial direction thereof;

a capacitor element provided with a frist terminal electrode formed on an outer peripheral surface thereof, a second through hole extending along a longitudinal axial direction thereof, and a second terminal electrode formed on an inner peripheral surface thereof and defining said second through hole;

a central conductor comprising a cylindrically rolled metal plate, which is inserted in said first and second through holes which are aligned along said axial direction to retain said magnetic element and said capacitor element in an axaially aligned state, said central conductor being electrically connected with said second terminal electrode of said capacitor element; and first and second external terminal means respectively provided on respective longitudinal end portions of said central conductor, said first and second external terminal means being electrically connected with said central conductor; and said central conductor being provided along at least part of its length along said longitudinal direction with an elastic contact portion which exerts an outward pressure radially of said central conductor to come into pressure contact with said second terminal electrode of said capacitor element to be electrically connected with the same, said elastic contact portion being located on an outer peripheral part of said rolled metal plate.

13. A chip-like LC filter in accordance with claim 12, wherein said first and second external terminal means respectively comprise first and second conductive cap-shaped members, one of said cap-shaped members at least partially covering said magnetic element which is located on an end portion of said central conductor and is electrically connected with said central conductor.

14. A chip-like LC filter in accordance with claim 13, further comprising a second magnetic element, said magnetic element, said capacitor element and said second magnetic element are arranged in this sequence on said central conductor, whereby said first and second cap-shaped members are arranged to at least partially cover said magnetic element and said second magnetic element respectively.

15. A chip-like LC filter in accordance with claim 12, wherein said capacitor element forms electrostatic capacitance between said first and second terminal electrodes.

16. A chip-like LC filter in accordance with claim 12, wherein said magnetic element and said capacitor element are in the form of cylinders, said first and second through holes are circular in cross-section, and said central conductor is in the form of a rod with a circular cross-section.

17. A chip-like LC filter in accordance with claim 16, wherein said central conductor is relatively increased in diameter in a portion provided with said elastic contact portion.

18. A chip-like LC filter in accordance with claim 16, wherein said first terminal electrode and said first and second external terminal means have outer peripheral surfaces aligned substantially in a common imaginary cylindrical surface.

* * * * *